(12) United States Patent
Itoh

(10) Patent No.: US 8,189,903 B2
(45) Date of Patent: May 29, 2012

(54) PHOTOMASK EVALUATION BASED ON LITHOGRAPHIC SIMULATION USING SIDEWALL ANGLE OF PHOTOMASK PATTERN

(75) Inventor: Masamitsu Itoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1110 days.

(21) Appl. No.: 11/636,631

(22) Filed: Dec. 11, 2006

(65) Prior Publication Data

US 2007/0150850 A1 Jun. 28, 2007

(30) Foreign Application Priority Data

Dec. 12, 2005 (JP) .................................. 2005-357935

(51) Int. Cl.
*G06K 9/00* (2006.01)
(52) U.S. Cl. .......................................... 382/144; 438/16
(58) Field of Classification Search .................... None
See application file for complete search history.

(56) References Cited

U.S. PATENT DOCUMENTS

| | | | |
|---|---|---|---|
| 6,272,236 | B1 | 8/2001 | Pierrat et al. |
| 6,559,048 | B1 * | 5/2003 | Kim et al. ..................... 438/637 |
| 6,783,904 | B2 * | 8/2004 | Strozewski et al. ............. 430/30 |
| 6,999,611 | B1 | 2/2006 | Lopez et al. |
| 8,023,723 | B2 * | 9/2011 | Ito ................................ 382/144 |
| 2003/0048458 | A1 * | 3/2003 | Mieher et al. ................. 356/601 |
| 2005/0265592 | A1 | 12/2005 | Asano et al. |
| 2008/0233487 | A1 * | 9/2008 | Huang et al. ..................... 430/5 |
| 2009/0123058 | A1 * | 5/2009 | Ito ................................ 382/144 |
| 2009/0214103 | A1 * | 8/2009 | Tanaka et al. ................. 382/145 |

FOREIGN PATENT DOCUMENTS

| | | |
|---|---|---|
| JP | 7-175204 | 7/1995 |
| JP | 2000-258352 | 9/2000 |
| JP | 2003-207879 | 7/2003 |
| JP | 2003-525529 | 8/2003 |
| JP | 2003-255509 | 9/2003 |
| JP | 2003-324041 | 11/2003 |
| JP | 2004-158478 | 6/2004 |
| JP | 2004-185019 | 7/2004 |
| JP | 2004-330310 | 11/2004 |
| JP | 2005-189491 | 7/2005 |
| JP | 2005-285898 | 10/2005 |

OTHER PUBLICATIONS

Kim et al. (Jul. 2002) "Aerial image degradation effects due to imperfect sidewall profiles of EAPSM mask for 130nm-device node: 3D EMF simulations and wafer printing results." Proc. SPIE vol. 4691, pp. 268-279.*

(Continued)

*Primary Examiner* — Bhavesh Metha
*Assistant Examiner* — Barry Drennan
(74) *Attorney, Agent, or Firm* — Finnegan, Henderson, Farabow, Garrett & Dunner, L.L.P.

(57) ABSTRACT

According to an aspect of the invention, there is provided a photomask evaluation method including, acquiring a pattern image of a photomask, generating sidewall angle data on the sidewall angle of a pattern from the pattern image, extracting a pattern outline from the pattern image to generate outline data, and running a lithographic simulation on the basis of the outline data and the sidewall angle data to calculate an exposure margin.

6 Claims, 6 Drawing Sheets

OTHER PUBLICATIONS

Chemali et al. (Aug. 2004) "Run-to-run critical dimension and sidewall angle lithography control using the PROLITH simulator." IEEE Trans. on Semiconductor Manufacturing, vol. 17 No. 3, pp. 388-401.*

Kariya et al. (Oct. 2005) "Mask pattern quality assurance based on lithography simulation with fine pixel SEM image." Proc. SPIE vol. 5992, pp. 1-8.*

Yamane et al. (Sep. 2005) "Sidewall effect of photomask by scanning electron microscope and optical critical dimension metrology." J. Microlith., Microfab., Microsyst., vol. 4 No. 3, pp. 1-11.*

Wang, W. C. et al., "Mask Pattern Fidelity Quantification Method," Proceedings of SPIE, vol. 5256, 23$^{rd}$ Annual BACUS Syposium on Photomask Technology, pp. 266-275, (2003).

"Notice of Reasons for Rejection" issued in copending Japanese patent application No. 2005-357935, mailed on Nov. 30, 2010, and English-language translation thereof.

* cited by examiner

PHOTOMASK EVALUATION BASED ON LITHOGRAPHIC SIMULATION USING SIDEWALL ANGLE OF PHOTOMASK PATTERN

CROSS-REFERENCE TO RELATED APPLICATIONS

This application is based upon and claims the benefit of priority from prior Japanese Patent Application No. 2005-357935, field Dec. 12, 2005, the entire contents of which are incorporated herein by reference.

BACKGROUND OF THE INVENTION

1. Field of the Invention

The present invention relates to a photomask evaluation method, a photomask evaluation apparatus and a semiconductor device manufacturing method associated with the manufacture of a photomask.

2. Description of the Related Art

Recently, problems in a photolithographic step used in a semiconductor manufacturing process have been increasingly prominent. There are increasing demands for miniaturization in the photolithographic step along with advancing miniaturization of semiconductor devices. Design rules for the devices have already reached a miniaturization of 55 nm, and pattern dimensional accuracy to be controlled is required to be 5 nm or less, which is extremely strict accuracy. Moreover, mask patterns are subjected to an optical proximity effect correction (OPC), and therefore have extremely complicated shapes.

Thus, one-dimensional dimensional uniformity tests such as a simple measurement of a pattern line width and a measurement of a hole diameter as have heretofore been carried out are insufficient, and two-dimensional dimensional management has been demanded. In response to this, a method has been employed wherein an image of a mask pattern is acquired by a scanning electron microscope (SEM), and a pattern outline is extracted from the image in order to run a lithographic simulation to find whether a desired lithographic margin can be obtained, thereby inspecting whether a mask pattern is finished in desired dimensions. The greatest advantage of this method is that the mask pattern can be judged in a state significantly close to a condition of the actual use in which a wafer is exposed, so that the management does not become unnecessarily rigorous or loose, and necessary and sufficient management can be conducted.

However, inadequacies have appeared even in this method from the viewpoint of accuracy in connection with the more rigorous dimensional management of masks in recent years. The reason is that the numerical aperture (NA) of a wafer exposure apparatus has increased and the influence of the sidewall angle of the mask pattern can no longer be neglected. To be specific, the sidewall angle of the mask pattern varies depending on the coverage ratio of the mask pattern and the position within the surface of the mask. Thus, if the outlines of the patterns are uniformly extracted from the SEM image neglecting the sidewall angles as heretofore, there arise cases where the results of a lithographic simulation from the outline data do not correspond to the exposure results of actual wafer.

It is to be noted that W. C. Wang et al., "Mask pattern fidelity quantification method" SPIE Vol. 5256(2003), p.p. 266-275 describe quantitative evaluation of mask quality in the fidelity of a 2D pattern and a method of evaluating the validity of an OPC model.

BRIEF SUMMARY OF THE INVENTION

According to an aspect of the invention, there is provided a photomask evaluation method comprising: acquiring a pattern image of a photomask; generating sidewall angle data on the sidewall angle of a pattern from the pattern image; extracting a pattern outline from the pattern image to generate outline data; and running a lithographic simulation on the basis of the outline data and the sidewall angle data to calculate an exposure margin.

According to another aspect of the invention, there is provided a photomask evaluation method comprising: acquiring a pattern image of a photomask; generating sidewall angle data on the sidewall angle of a pattern from the pattern image; extracting a pattern outline from the pattern image to generate outline data; correcting a pattern outline position of the outline data on the basis of the sidewall angle data; and running a lithographic simulation on the basis of the corrected outline data to calculate an exposure margin.

According to another aspect of the invention, there is provided a photomask evaluation apparatus comprising: a pattern image acquiring section for acquiring a pattern image of a photomask; a pattern sidewall angle analyzing section for generating sidewall angle data on the sidewall angle of a pattern from the pattern image acquired by the pattern image acquiring section; a pattern outline extracting section for extracting a pattern outline from the pattern image acquired by the pattern image acquiring section to generate outline data; a lithographic simulator which runs a lithographic simulation on the basis of the outline data generated by the pattern outline extracting section and the sidewall angle data generated by the pattern sidewall angle analyzing section to calculate an exposure margin.

According to another aspect of the invention, there is provided a photomask evaluation apparatus comprising: a pattern image acquiring section for acquiring a pattern image of a photomask; a pattern sidewall angle analyzing section for generating sidewall angle data on the sidewall angle of a pattern from the pattern image acquired by the pattern image acquiring section; a pattern outline extracting section for extracting a pattern outline from the pattern image acquired by the pattern image acquiring section to generate outline data; an outline data correcting section for correcting, on the basis of the sidewall angle data generated by the pattern sidewall angle analyzing section, a pattern outline position of the outline data generated by the pattern outline extracting section; and a lithographic simulator which runs a lithographic simulation on the basis of the outline data corrected by the outline data correcting section to calculate an exposure margin.

According to another aspect of the invention, there is provided a semiconductor device manufacturing method comprising: acquiring a pattern image of a photomask; generating sidewall angle data on the sidewall angle of a pattern from the pattern image; extracting a pattern outline from the pattern image to generate outline data; and running a lithographic simulation on the basis of the outline data and the sidewall angle data to calculate an exposure margin, and forming a circuit pattern on a semiconductor substrate to manufacture a semiconductor device by using the photomask in which the exposure margin satisfies a predetermined specification.

According to another aspect of the invention, there is provided a semiconductor device manufacturing method comprising: acquiring a pattern image of a photomask; generating sidewall angle data on the sidewall angle of a pattern from the pattern image; extracting a pattern outline from the pattern image to generate outline data; correcting a pattern outline position of the outline data on the basis of the sidewall angle data; and running a lithographic simulation on the basis of the corrected outline data to calculate an exposure margin, and forming a circuit pattern on a semiconductor substrate to manufacture a semiconductor device by using the photomask in which the exposure margin satisfies a predetermined specification.

DETAILED DESCRIPTION OF THE INVENTION

Embodiments of the present invention will hereinafter be described with reference to the drawings.

First, an ArF-halftone (HT) mask was prepared which was a photomask manufactured by an ordinary photomask manufacturing process. A pattern formed on this ArF-HT mask is a memory device under a design rule of 55 nm, and places where lithographic margins are low (referred to as hot spots) have been extracted in advance from this mask pattern. To extract the hot spots, the places where the lithographic margins are low are specified by a lithographic simulation of a chip from data obtained after an optical proximity effect correction (OPC) of design data. This time, 64 hot spots were extracted.

The prepared ArF-HT mask was set on a fine pixel SEM (NGR4000) manufactured by Topcon Corporation, and an SEM image of the hot spots was acquired. NGR4000 is an apparatus capable of acquiring a fine pixel image having 8000×8000 pixels, and has such a high resolution that one pixel is 2 nm on the mask. That is, the viewing field of the acquired image is 16 µm square, which is a size sufficient to run the lithographic simulation.

Figure 1B:
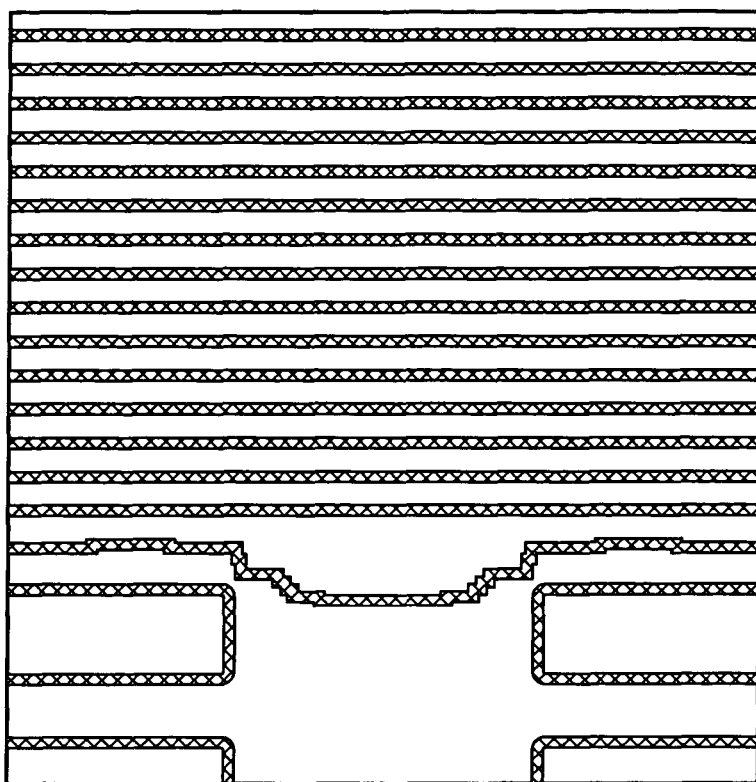
FIGS. 1A and 1B are diagrams showing an SEM image of an ArF-HT mask and pattern outline data extracted from the SEM image according to a first embodiment.
Figure 1A:
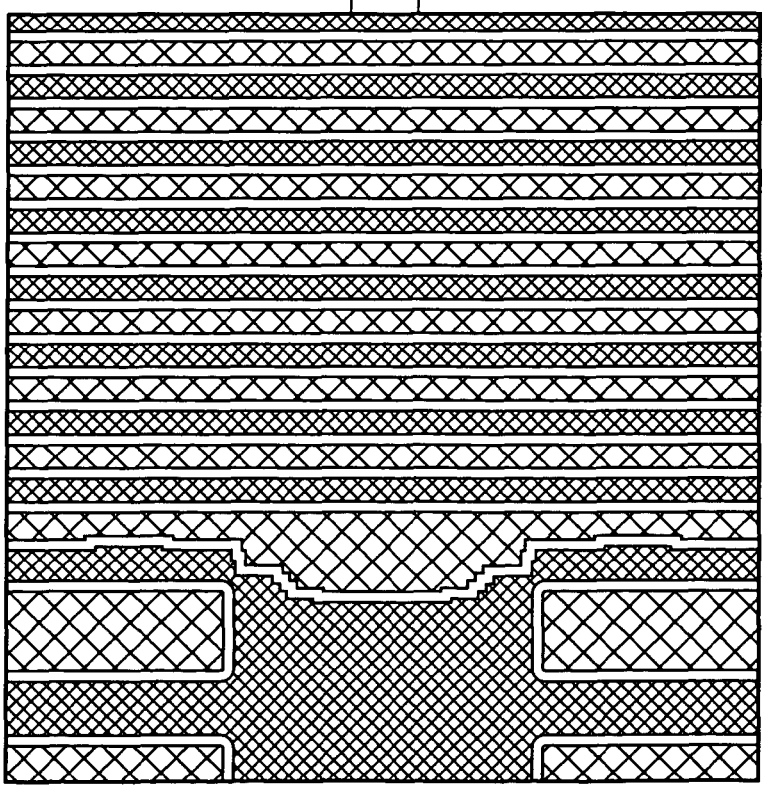

FIG. 1A is a diagram showing the SEM image of the ArF-HT mask, and FIG. 1B is a diagram showing pattern outline data extracted from the SEM image. The outline of the pattern was extracted by outline extraction software manufactured by NGR Corporation from the acquired SEM image shown in FIG. 1A, thereby acquiring the pattern outline data shown in FIG. 1B. Then, the sidewall angle of the mask pattern was obtained from the width of a white line forming the pattern outline in the SEM image in FIG. 1A.

Figure 2:
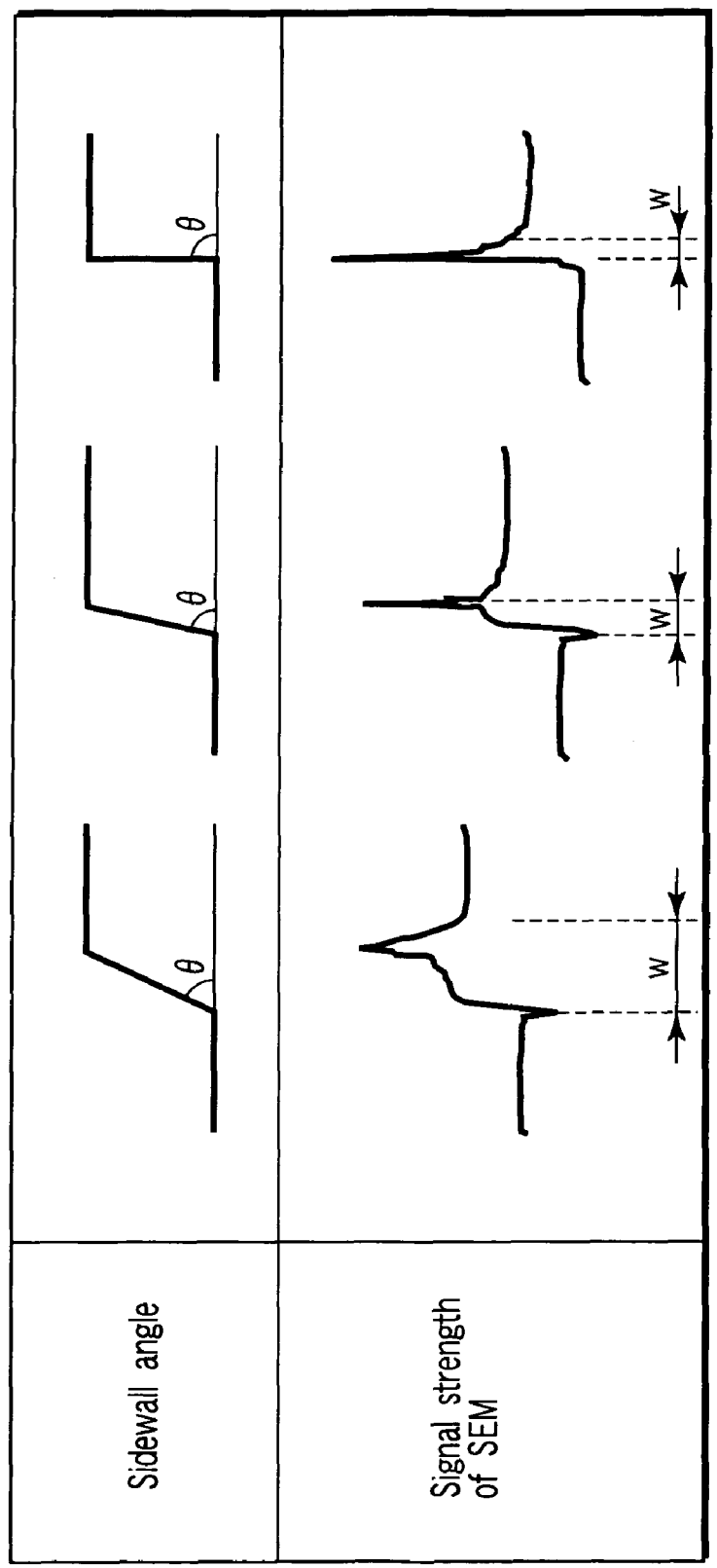
FIG. 2 is a diagram showing the relation between the sidewall angle of a mask pattern and the signal intensity profile of the SEM image according to the first embodiment.

FIG. 2 is a diagram showing the relation between the sidewall angle of the mask pattern and the signal intensity profile of the SEM image. As shown in FIG. 2, there is a principle that a width (a part where the signal intensity profile stands out) w of the white line in the SEM image is great when a sidewall angle θ of the mask pattern is small, while the width w of the white line is short when the sidewall angle θ is large. This principle was utilized to obtain the sidewall angle of the pattern of the ArF-HT mask. Actually, not simply on the basis of the width of the white line, but also on the basis of a subtle difference of intensity profiles of the white lines forming the pattern outlines in the pattern image which is the SEM image, the intensity profile is matched with previously obtained intensity profile data per sidewall angle, thereby obtaining a sidewall angle. For the obtained sidewall angle, pattern sidewall angle data and the pattern outline data were stored in association with each other at predetermined intervals (e.g., every 100 pixels) for each outline.

Figure 3:
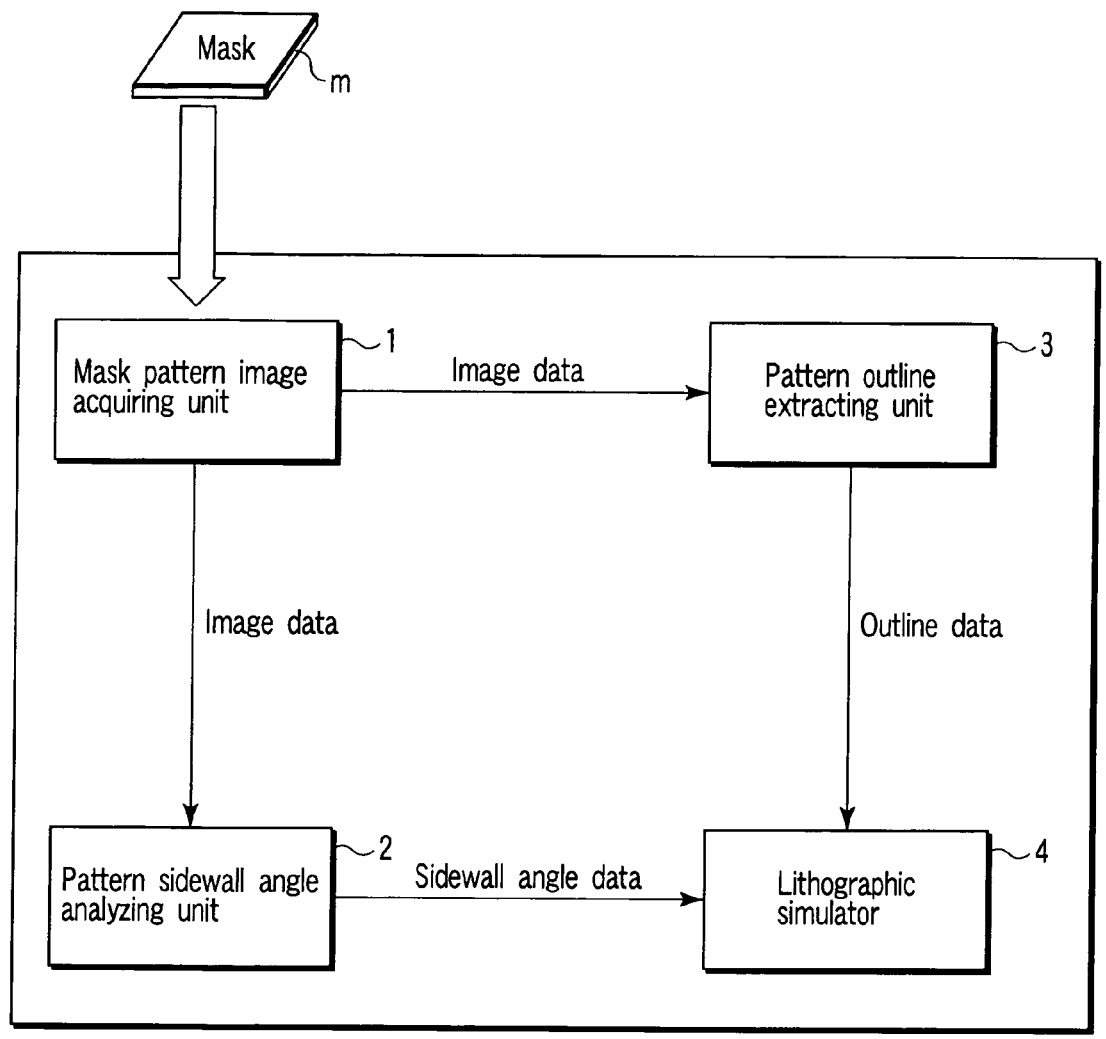
FIG. 3 is a block diagram showing the configuration of a photomask evaluation apparatus according to the first embodiment.

FIG. 3 is a block diagram showing the configuration of a photomask evaluation apparatus according to the present first embodiment. A photomask evaluation method in the present first embodiment can be carried out by one photomask evaluation apparatus shown in FIG. 3.

As shown in FIG. 3, a mask pattern image acquiring unit 1 is connected to a lithographic simulator 4 via a pattern sidewall angle analyzing unit 2, and also connected to the lithographic simulator 4 via a pattern outline extracting unit 3. The mask pattern image acquiring unit 1 acquires a pattern image of an ArF-HT mask m set in the present apparatus. The pattern sidewall angle analyzing unit 2 generates pattern sidewall angle data which is information on the sidewall angle of the pattern from the acquired pattern image. The pattern outline extracting unit 3 extracts pattern outline from the acquired pattern image and generates pattern outline data. The lithographic simulator 4 runs a lithographic simulation on the basis of the pattern outline data and the pattern sidewall angle data.

Figure 4:
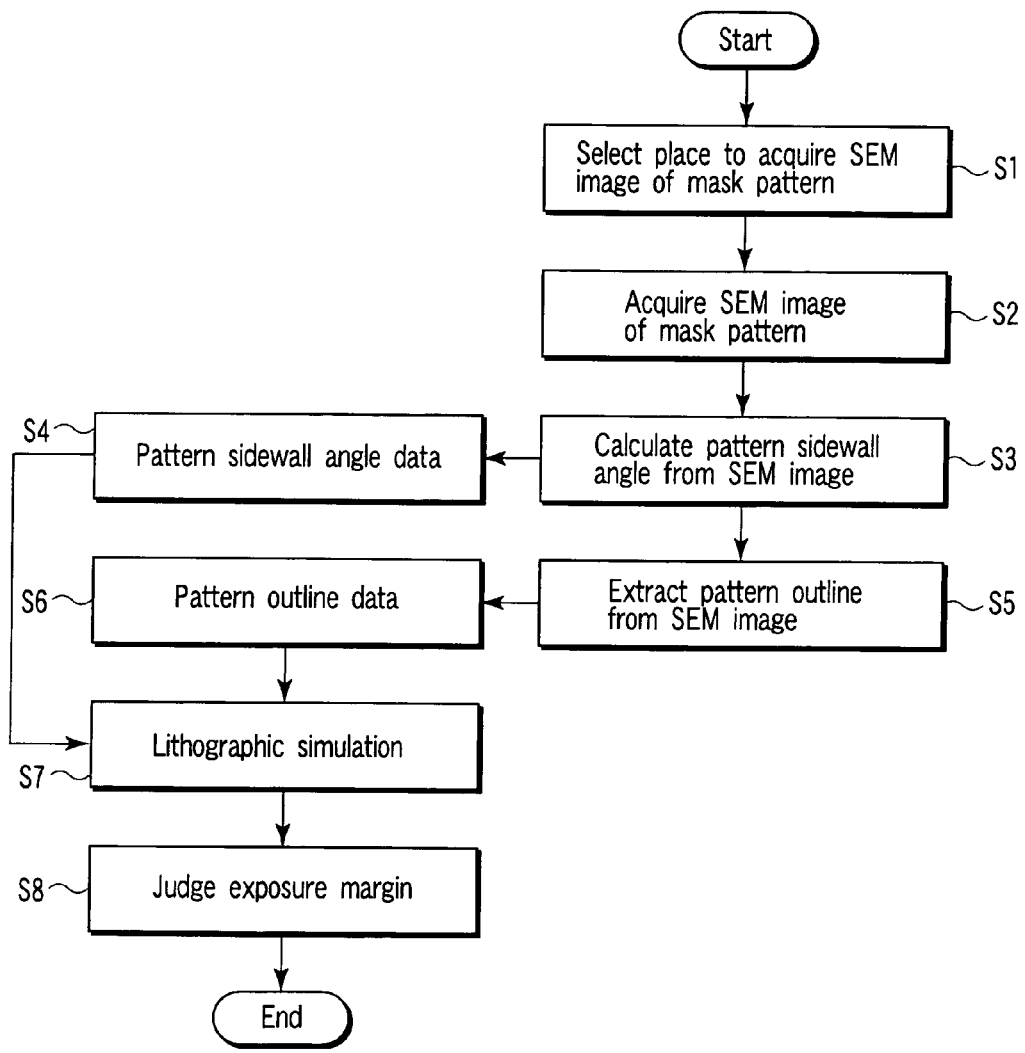
FIG. 4 is a flowchart showing the procedure of a photomask evaluation method according to the first embodiment.

FIG. 4 is a flowchart showing the procedure of a photomask evaluation method in the present first embodiment. First, in step S1, an inspector selects by an SEM a place to acquire an SEM image in a mask pattern of the ArF-HT mask m. In step S2, the mask pattern image acquiring unit 1 acquires an SEM image (pattern image) of the mask pattern. In step S3, the pattern sidewall angle analyzing unit 2 calculates a pattern sidewall angle from the pattern image which is the SEM image in accordance with the principle described above, thereby obtaining pattern sidewall angle data in step S4. After step S3, the pattern outline extracting unit 3 extracts in step S5 a pattern outline from the pattern image which is the SEM image, thereby obtaining pattern outline data in step S6.

Next, in step S7, the pattern sidewall angle data and the pattern outline data are input to the in-house lithographic simulator 4, and a lithographic simulation was run under optical conditions used when a wafer was exposed by use of the manufactured ArF-HT mask m.

As a result, it was calculated in step S8 that an exposure dose margin was 8% and the depth of focus was 0.21 µm at which desired pattern dimensions could be obtained on the wafer. Since it is necessary that the exposure dose margin be 10% or more and the depth of focus be 0.2 µm or more to obtain the desired pattern dimensions, the place of the hot spot of the ArF-HT mask m this time does not fulfill the specification in the exposure dose margin, so that the ArF-HT mask m is judged as a reject product. It is to be noted that both or one of the exposure dose margin (exposure dose range) and the depth of focus necessary to obtain the desired pattern dimensions are called an exposure margin. Alternatively, the exposure margin may be defined by pattern dimensions obtained by an optimum exposure dose and an optimum focal position.

For comparison, when the pattern outline data alone was used to simply run the same simulation with a fixed sidewall angle, an exposure dose margin obtained was 11% and a depth of focus obtained was 0.23 μm, such that the ArF-HT mask m was judged as an acceptable product.

Thus, this ArF-HT mask m was actually used to form a resist pattern on a wafer. An exposure apparatus was a liquid immersion exposure apparatus manufactured by Nikon Corporation, and NA was 0.92. Moreover, polarized illumination was employed. As a result, the desired pattern dimensions were obtained with an exposure dose margin of 8% and a depth of focus of 0.22 μm. This reveals that the influence of the sidewall angle of the mask is greater in the light exposure with a high NA such as liquid immersion exposure. Thus, as in the present first embodiment, considering the fluctuation of the sidewall angle of the mask enables a more faithful lithography simulation and improved accuracy in the judgment of the acceptability of the mask.

As a second embodiment, a case will be described in which the pattern outline data is corrected on the basis of the pattern sidewall angle data. The procedure up to the acquisition of the pattern sidewall angle data and the pattern outline data from the SEM image of the hot spot is the same as that in the first embodiment described above. The difference is that an outline position of the pattern outline data is corrected on the basis of the pattern sidewall angle data.

Figure 5:
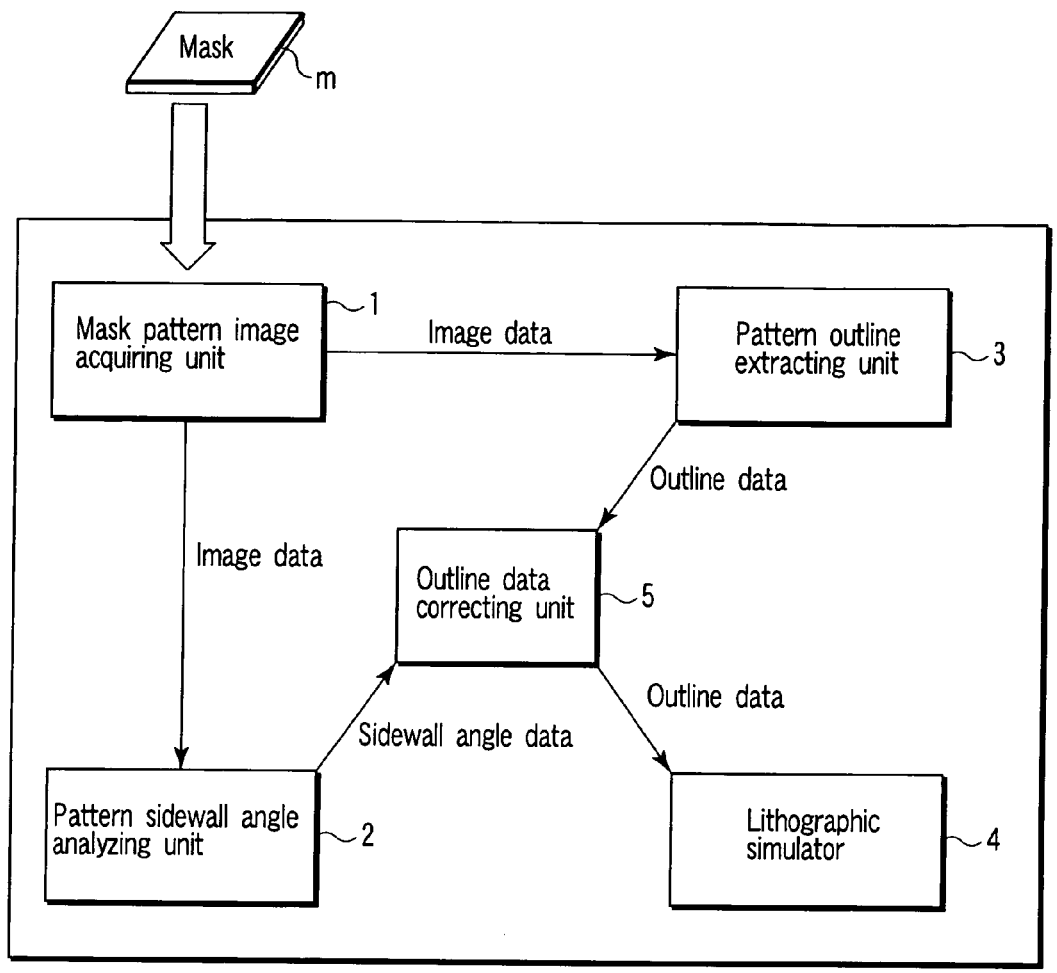
FIG. 5 is a block diagram showing the configuration of a photomask evaluation apparatus according to a second embodiment.

FIG. 5 is a block diagram showing the configuration of a photomask evaluation apparatus according to the present second embodiment. A photomask evaluation method in the present second embodiment can be carried out by one photomask evaluation apparatus shown in FIG. 5. In FIG. 5, the same reference numerals are assigned to the same parts as those in FIG. 3.

As shown in FIG. 5, a mask pattern image acquiring unit 1 is connected to an outline data correcting unit 5 via a pattern sidewall angle analyzing unit 2, and also connected to the outline data correcting unit 5 via a pattern outline extracting unit 3. The outline data correcting unit 5 is connected to a lithographic simulator 4. The outline data correcting unit 5 corrects a pattern outline position of the pattern outline data generated in the pattern outline extracting unit 3 on the basis of the pattern sidewall angle data generated in the pattern sidewall angle analyzing unit 2. The lithographic simulator 4 runs a lithographic simulation on the basis of the pattern outline data which has been corrected by the outline data correcting unit 5.

Figure 6:
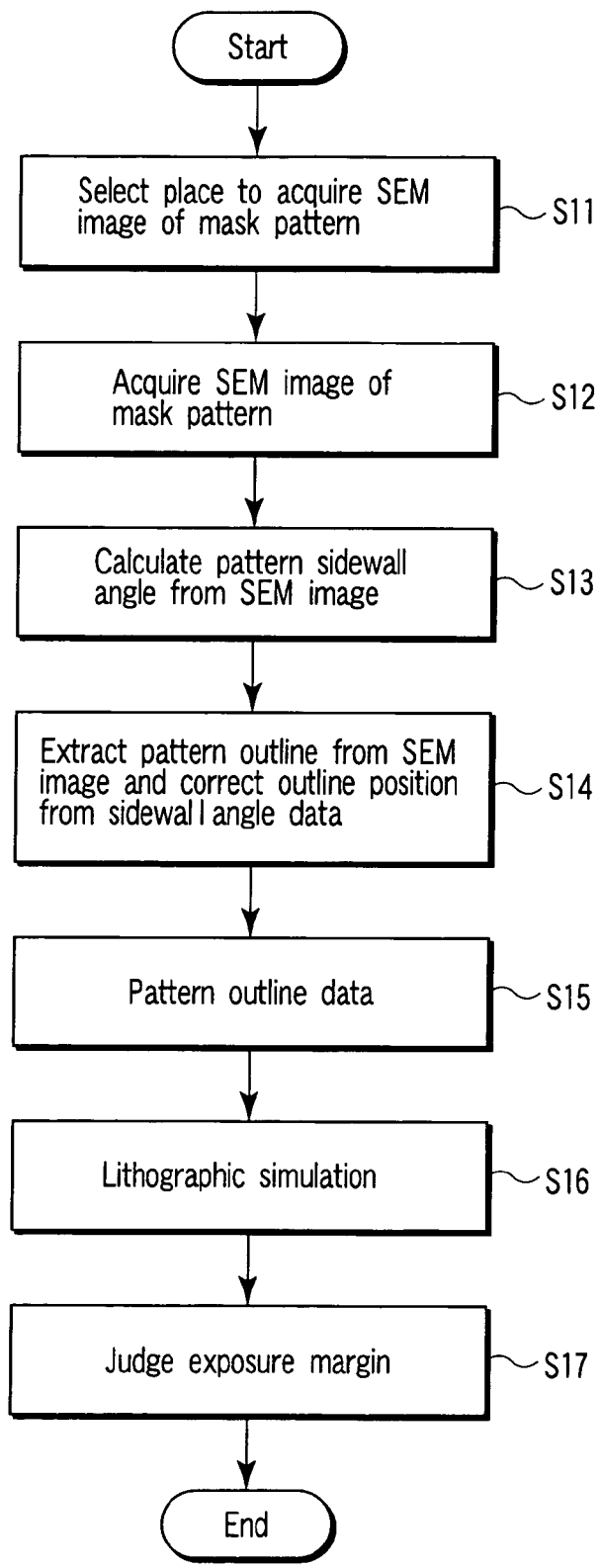
FIG. 6 is a flowchart showing the procedure of a photomask evaluation method according to the second embodiment.

FIG. 6 is a flowchart showing the procedure of the photomask evaluation method according to the present second embodiment. First, in step S11, an inspector selects by an SEM a place to acquire an SEM image in a mask pattern of the ArF-HT mask m. In step S12, the mask pattern image acquiring unit 1 acquires an SEM image (pattern image) of the mask pattern. In step S13, the pattern sidewall angle analyzing unit 2 calculates a pattern sidewall angle from the pattern image which is the SEM image in accordance with the principle described above, thereby obtaining pattern sidewall angle data. In step S14, the pattern outline extracting unit 3 extracts a pattern outline from the pattern image which is the SEM image to obtain pattern outline data, and the outline data correcting unit 5 corrects the outline position of the pattern outline data on the basis of the pattern sidewall angle data, thereby obtaining corrected pattern outline data in step S15.

Next, in step S16, the corrected pattern outline data is input to the in-house lithographic simulator 4, and a lithographic simulation was run under optical conditions used when a wafer was exposed by use of the manufactured ArF-HT mask m, thereby calculating an exposure margin in step S17.

The processing in step S14 means that the pattern outline extracted under uniform conditions from the SEM image is corrected to an optically significant outline position. The processing in the present second embodiment is effective when the pattern sidewall angle data is not easily taken into the lithographic simulation.

Figure 7:
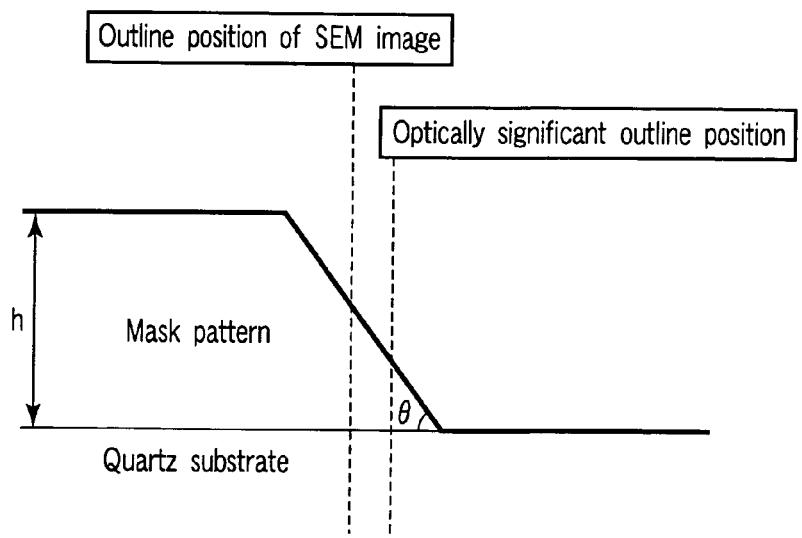
FIG. 7 is a diagram showing an outline position of an SEM image and an optically significant outline position in the section of a mask pattern according to the second embodiment.

FIG. 7 is a diagram showing the outline position of the SEM image and an optically significant outline position in the section of a mask pattern. In the case of the outline in an SEM image conventionally used, an outline as high as about 50% of a thickness h of a halftone film is extracted. On the other hand, an optically significant outline in the lithographic simulation which considers the mask as a planar object without a three-dimensional structure is located at about 25% from the bottom of the halftone film. That is, as shown in FIG. 7, the optically significant outline position corresponds to an outline shifted outside the outline position acquired from the SEM image. A uniform shift amount has only to be added to the outline position from the SEM image when the sidewall angle θ is fixed, but a shift amount corresponding to the sidewall angle needs to be added to the outline position from the SEM image when the sidewall angle varies depending on the place. For example, the smaller the sidewall angle θ is, the greater the shift amount is.

In the present second embodiment, the outline position is corrected with the pattern sidewall angle data. That is, the outline position is shifted in accordance with the sidewall angle. The lithographic simulation was run with this corrected pattern outline data, such that an improvement substantially equal to that in the first embodiment described above was verified in the accuracy of the mask acceptability judgment.

As described above, according to the embodiments, the information on the sidewall angle of the mask pattern is acquired from the acquired SEM image, and the lithographic simulation is run on the basis of the pattern sidewall angle data and the pattern outline data. Alternatively, the outline position of the pattern outline data is corrected on the basis of the pattern sidewall angle data, and the lithographic simulation is run on the basis of the corrected pattern outline data. An exposure margin thus calculated is judged to find out whether this exposure margin is the desired exposure margin, such that it is possible to inspect whether the mask pattern is finished in desired dimensions.

Thus, it is possible to properly take, into the lithographic simulation, the influence of the sidewall angle of the mask pattern which has heretofore been a problem, and achieve the correspondence between the results of the lithographic simulation and the results of the actual wafer light exposure.

It is to be noted that the present invention is not exclusively limited to the embodiments described above, and modifications can be properly made without departing from the spirit thereof. For example, the information on the sidewall angle of the pattern may be acquired separately by a scatterometry method based on an optical technique, rather than from the SEM image. Moreover, this information may be acquired from an SEM which obliquely applies an electron beam. Further, while the photomask evaluation method has been described in the embodiments, a photomask judged to satisfy a desired specification by this evaluation method can be used to form a circuit pattern on a semiconductor substrate such that a semiconductor device is manufactured.

According to the present embodiments, it is possible to provide a photomask evaluation method, a photomask evaluation apparatus and a semiconductor device manufacturing method capable of achieving the correspondence between the results of the lithographic simulation and the results of the actual wafer light exposure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photomask evaluation method comprising:
   acquiring a pattern image of a photomask;
   generating sidewall angle data on the sidewall angle of a pattern from the pattern image;
   extracting a pattern outline from the pattern image to generate outline data;
   correcting a pattern outline position of the outline data on the basis of the sidewall angle data; and
   running a lithographic simulation on the basis of the corrected outline data to calculate an exposure margin.

2. The photomask evaluation method according to claim 1, wherein the sidewall angle data is generated on the basis of an intensity profile of a white line forming the pattern outline in the pattern image obtained by a scanning electron microscope.

3. The photomask evaluation method according to claim 1, wherein the exposure margin indicates both or one of an exposure dose range and a depth of focus necessary to obtain a desired pattern dimension.

4. The photomask evaluation method according to claim 1, wherein the exposure margin indicates a pattern dimension obtained by an optimum exposure dose and an optimum focal position.

5. A photomask evaluation apparatus comprising:
   a scanning electron microscope for acquiring a pattern image of a photomask;
   a pattern sidewall angle analyzing unit for generating sidewall angle data on the sidewall angle of a pattern from the pattern image acquired by the scanning electron microscope;
   a pattern outline extracting unit for extracting a pattern outline from the pattern image acquired by the scanning electron microscope to generate outline data;
   an outline data correcting unit for correcting, on the basis of the sidewall angle data generated by the pattern sidewall angle analyzing unit, a pattern outline position of the outline data generated by the pattern outline extracting unit; and
   a lithographic simulator which runs a lithographic simulation on the basis of the outline data corrected by the outline data correcting unit to calculate an exposure margin.

6. The photomask evaluation apparatus according to claim 5, wherein the pattern sidewall angle analyzing unit generates sidewall angle data on the basis of an intensity profile of a white line forming a pattern outline in the pattern image obtained by the scanning electron microscope.

* * * * *